United States Patent
Nikonov et al.

(10) Patent No.: US 10,608,167 B2
(45) Date of Patent: Mar. 31, 2020

(54) SPIN LOGIC WITH MAGNETIC INSULATORS SWITCHED BY SPIN ORBIT COUPLING

(71) Applicant: Intel Corporation, Santa Clara, CA (US)

(72) Inventors: Dmitri E. Nikonov, Beaverton, OR (US); Sasikanth Manipatruni, Portland, OR (US); Anurag Chaudhry, Sunnyvale, CA (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/751,102

(22) PCT Filed: Sep. 10, 2015

(86) PCT No.: PCT/US2015/049506
§ 371 (c)(1),
(2) Date: Feb. 7, 2018

(87) PCT Pub. No.: WO2017/044109
PCT Pub. Date: Mar. 16, 2017

(65) Prior Publication Data
US 2018/0240964 A1    Aug. 23, 2018

(51) Int. Cl.
*H01L 43/04*    (2006.01)
*H01L 43/08*    (2006.01)
*H01L 43/10*    (2006.01)
*H03K 19/18*    (2006.01)
*H01L 43/06*    (2006.01)

(52) U.S. Cl.
CPC ............ *H01L 43/04* (2013.01); *H01L 43/065* (2013.01); *H01L 43/08* (2013.01); *H01L 43/10* (2013.01); *H03K 19/18* (2013.01)

(58) Field of Classification Search
CPC ....... H01L 43/04; H01L 43/065; H01L 43/06; H03K 19/18; G11C 11/16
See application file for complete search history.

(56) References Cited

U.S. PATENT DOCUMENTS

| 9,858,975 B1* | 1/2018 | Hatcher .............. G11C 11/1655 |
| 2006/0164124 A1 | 7/2006 | Koch et al. |
| 2013/0200446 A1 | 8/2013 | Wunderlich et al. |

(Continued)

FOREIGN PATENT DOCUMENTS

JP    2012049403    3/2012

OTHER PUBLICATIONS

International Search Report and Written Opinion for International Patent Application No. PCT/US2015/049506, dated Jun. 23, 2016.

(Continued)

*Primary Examiner* — Nduka E Ojeh
(74) *Attorney, Agent, or Firm* — Green, Howard & Mughal LLP

(57) ABSTRACT

Described is an apparatus which comprises: a first non-magnetic conductor; a first spin orbit coupling (SOC) layer coupled to the first non-magnetic conductor; a first ferromagnet (FM) coupled to the SOC layer; a second FM; and an insulating FM sandwiched between the first and second FMs.

18 Claims, 6 Drawing Sheets

(56) References Cited

U.S. PATENT DOCUMENTS

| | | | |
|---|---|---|---|
| 2014/0139265 A1* | 5/2014 | Manipatruni | H03K 19/16 |
| | | | 326/101 |
| 2014/0169088 A1* | 6/2014 | Buhrman | G11C 11/18 |
| | | | 365/158 |
| 2015/0269478 A1* | 9/2015 | Datta | G06N 3/063 |
| | | | 706/33 |
| 2016/0276006 A1* | 9/2016 | Ralph | G11C 11/18 |
| 2018/0240583 A1* | 8/2018 | Manipatruni | G11C 11/161 |

OTHER PUBLICATIONS

International Preliminary Report on Patentability for International Patent Application No. PCT/US15/49506, dated Mar. 22, 2018.

Datta, S. et al., "Non-volatile spin switch for Boolean and non-Boolean logic", Appl. Phys. Lett. 101, 252411 (2012); https://doi.org/10.1063/1.4769989 Published Online: Dec. 20, 2012, 6 pages.

* cited by examiner

US 10,608,167 B2

SPIN LOGIC WITH MAGNETIC INSULATORS SWITCHED BY SPIN ORBIT COUPLING

CLAIM OF PRIORITY

This Application is a National Stage Entry of, and claims priority to, PCT Application No. PCT/US15/49506, filed on 10 Sep. 2015 and titled "SPIN LOGIC WITH MAGNETIC INSULATORS SWITCHED BY SPIN ORBIT COUPLING", which is incorporated by reference in its entirety for all purposes.

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (i.e., preserving a computation state when a power to an integrated circuit is switched off). Non-volatile logic can improve the power and computational efficiency by allowing architects to put a processor to un-powered sleep states more often with less energy. Existing spintronic logic generally suffer from high energy and relatively long switching times.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
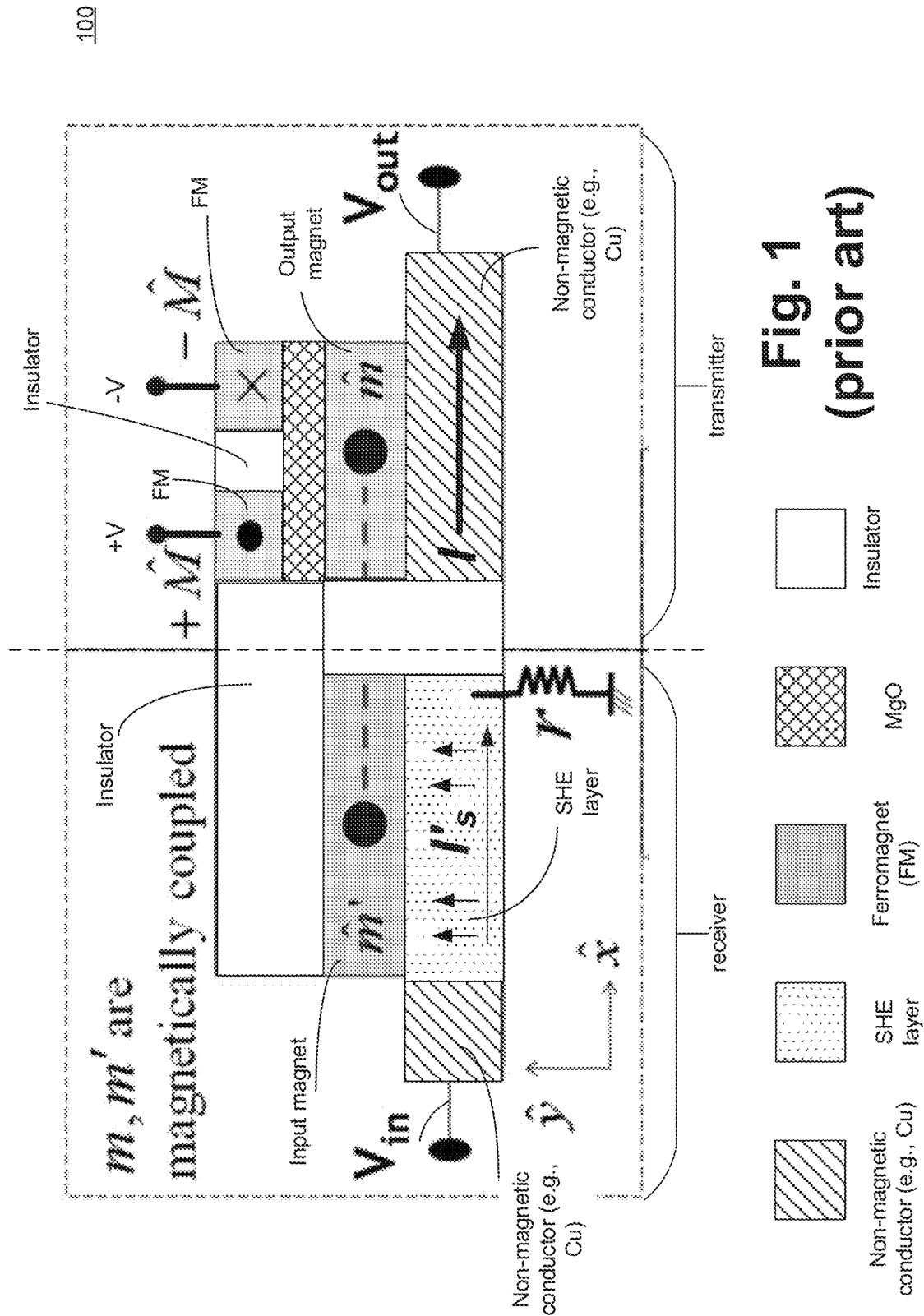
FIG. 1 illustrates a cross-section of a charge-spin logic (CSL) with slow switching speed due to weak dipole magnetic coupling between nanomagnets.

FIG. 1 illustrates cross-section 100 of a charge-spin logic (CSL) with slow switching speed and unreliable switching due to weak coupling between nanomagnets. Here, the section left of the vertical dotted line is the receiver (or write unit) and the section to the right of the vertical dotted line is the transmitter (or the read unit). The receiver receives input $V_{in}$ by a non-magnetic conductor (e.g., Cu) which is coupled to a material exhibiting Spin Hall Effect (SHE). When input charge current from $V_{in}$ passes from the non-magnetic conductor to the layer exhibiting SHE (i.e., the SHE layer), the charge current causes spin polarized current $I'_s$ to flow to the surface of the SHE layer. The surface of the SHE layer is coupled to an Input ferromagnet (FM). The spin polarized current $I'_s$ applies spin transfer torque (STT) to the Input FM which can switch the magnetization of the Input FM. As such, data associated with the input charge current (supplied by $V_{in}$) is "written" or "received" by the Input FM.

The Input FM and SHE layer of FIG. 1 is insulated from the transmitter (i.e., right side of the vertical dotted line) via an Insulator. The transmitter here consists of multiple layers—a non-magnetic layer and two Magnetic Tunnel Junctions (MTJs), where one of the MTJ is biased by voltage −V while the other MTJ is biased by voltage +V. The MTJs are formed with two layers of magnets—fixed and free magnets—separated by a tunneling dielectric layer (e.g., MgO). Here, one of the layers common to both MTJs is the Output FM (i.e., the free magnet) which is coupled to the layer of MgO and to the non-magnetic conductor. The other side of the tunneling dielectric MgO is coupled to two fixed magnets separated by an insulator. The fixed magnets can have different values of coercive fields $H_{c1}$ and $H_{c2}$ and are initially set to opposite directions of magnetization (indicated by the dot and cross on the FMs and positive (+M) and negative (−M) magnetizations). This is done by magnetic annealing first in a stronger external magnetic field (i.e., greater than $H_{c2}$) in one direction and then in a weaker magnetic field (i.e., lesser than $H_{c2}$ but greater than $H_{c1}$) in an opposite direction.

The Output FM of the transmitter is switched by magnetic dipole coupling via the Input FM. This coupling causes a current I to flow through the non-magnetic conductor with the aid of Tunneling Magneto-resistance (TMR) effect: larger resistance of the MTJ if the magnetizations are anti-parallel and smaller resistance of the MTJ if the magnetizations are parallel. TMR uses spin-to-charge variable conversion with limited conversion efficiency. Voltages of different polarities (i.e., +V and −V) are applied to the fixed magnet layers of the two MTJs. Depending on the magnetization direction of the free Output FM, its voltage will be greater or lesser than zero. The sign of the resulting current I (which is collected at the $V_{out}$ terminal) is determined by $V_{out}$, the voltage at the Output FM.

While the CSL of FIG. 1 functionally operates, it suffers from several drawbacks. For example, the magnetic dipole coupling between the Input FM and the Output FM via the Insulator is too weak (e.g., 100 Oe), and thus an Input FM with larger magnetic moment is required. As such, a stronger current I from $V_{in}$ terminal is needed to switch the magnetization of the Input FM via the SHE layer. This current applies spin transfer torque on the Output FM and can disturb its magnetization. Thus such switching is unreliable and does not ensure input-output isolation. The stronger current requirement directly contradicts with mitigation of read-disturb (i.e., there is a high likelihood of read-disturb from stronger currents). The weak magnetic dipole coupling also causes slow switching of the Output FM.

To fix at least the above mentioned shortcomings of the CSL of FIG. 1, some embodiments use FMs with strong exchange coupling to reduce switching times relative to the long switching times of the CSL of FIG. 1. In some embodiments, composite nanomagnets comprising of two FM metal layers which are separated by an insulating FM (IFM) layer is provided. In some embodiments, an apparatus or logic (or receiver) is provided which comprises a first non-magnetic conductor; a first spin orbit coupling (SOC) layer coupled to the first non-magnetic conductor; a first FM coupled to the SOC layer; a second FM; and a FM insulator sandwiched between the first and second FMs.

There are many technical effects/benefits of the various embodiments of this disclosure. For example, the apparatus of various embodiments has a faster switching time than the CSL of FIG. 1. The apparatus of various embodiments is also smaller in size than the CSL of FIG. 1 because it has fewer magnets than the CSL of FIG. 1. In some embodiments, there are no tunneling barriers (i.e., no MgO) layer and hence the apparatuses of some embodiments are more reliable that the CSL of FIG. 1 because tunneling barriers often break down with high tunneling currents resulting in device failures. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
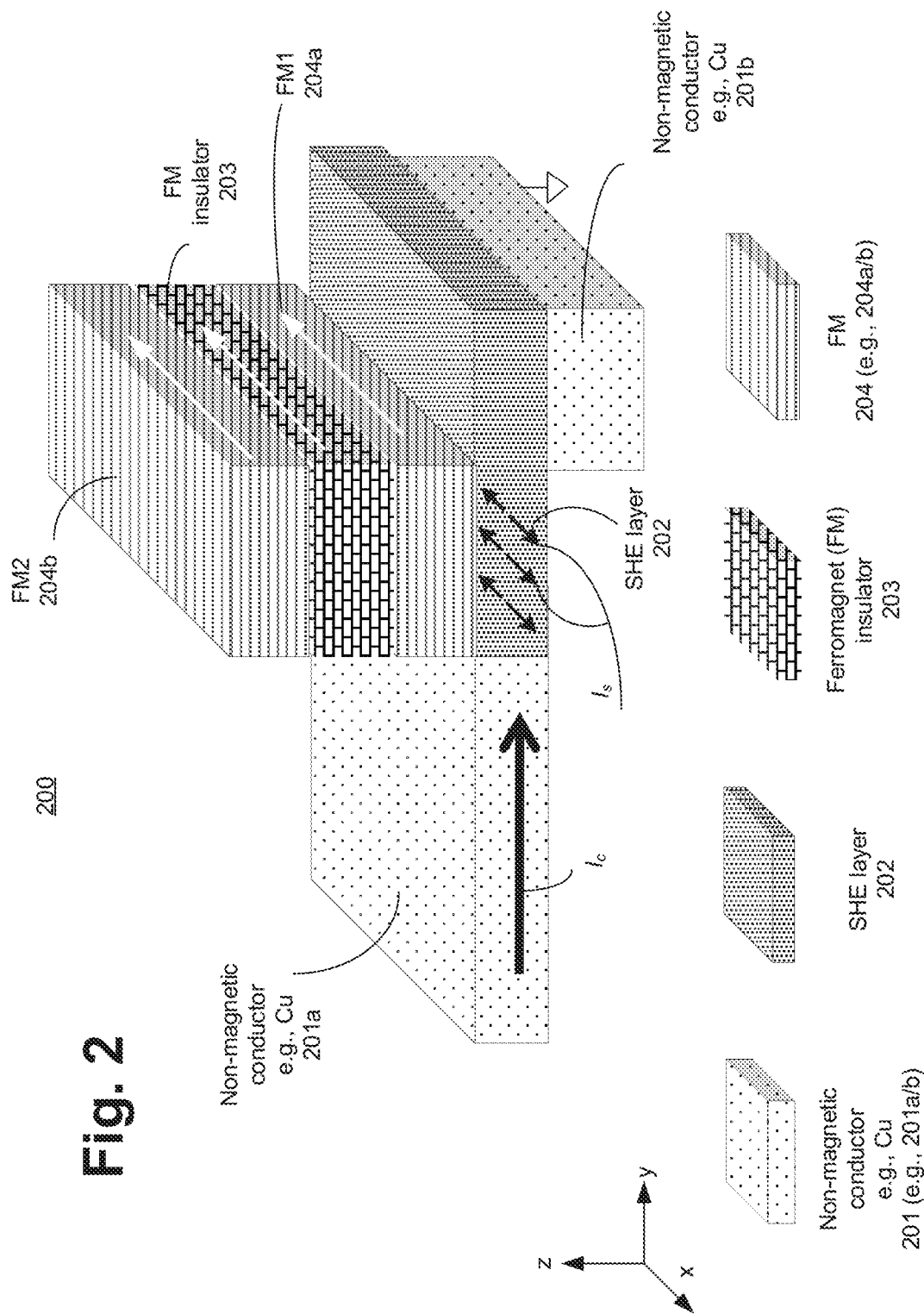
FIG. 2 illustrates a receiver with Spin Orbit Coupling (SOC) and a ferromagnet (FM) insulator coupled between FMs, according to some embodiments of the disclosure.

FIG. 2 illustrates receiver 200 with SOC and a FM insulator coupled between FMs, according to some embodiments of the disclosure. In some embodiments, receiver 200 comprises non-magnetic conductors (e.g., Cu) 201a and 201b, SOC layer 202, first FM 204a (i.e., FM1), second FM 204b (i.e., FM2), and FM insulator 203. In the following embodiments, SOC layer 202 is any layer that exhibits spin Hall effect. As such, SOC layer 202 is also referred to as SHE layer 203. In some embodiments, non-magnetic conductor 201a is coupled to SHE layer 202 and provides SHE layer 202 with input charge current $I_c$. In some embodiments, at least a portion of the bottom surface of SHE layer 202 is coupled to non-magnetic conductor 201b which is coupled to ground. In some embodiments, at least a portion of the top surface of SHE layer 202 is coupled to FM1 204a. In some embodiments, FM1 204a is coupled to FM Insulator 203 which in-turn is coupled to FM2 204b.

In some embodiments, SHE layer 202 (or the write electrode) is made of one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. SHE layer 202 transitions into high conductivity non-magnetic metal(s) layer (201a) to reduce the resistance of the connection to the SHE layer 202. The non-magnetic metal(s) are formed from one or more of: Cu, Co, α-Ta, Al, CuSi, or NiSi.

In some embodiments, FM insulator 203, which is sandwiched between FM1 204a and FM2 204b, is formed of one or more of: Yttrium-iron garnet (YIG) $Y_3Fe_5O_{12}$, magnetite $Fe_3O_4$, $Fe_2O_3$, NiO, $Tb_3Fe_5O_{12}$, or $CrO_2$.

In some embodiments, FMs 204a/b (collectively also referred here as FM 204) are free magnets that are made from CFGG (i.e., Cobalt (Co), Iron (Fe), Germanium (Ge), or Gallium (Ga) or a combination of them). In some embodiments, FMs 204a/b are formed with high spin polarization materials. Heusler alloys are an example of high spin polarization materials. Heusler alloys are ferromagnetic because of double-exchange mechanism between neighboring magnetic ions. FMs 204a/b are also referred to as First and Second Magnet contacts. FM1 204a is also referred to as the input magnet while FM2 204b is also referred to as the output magnet. These labels are provided for purposes of describing the various embodiments, but do not change the structure of receiver 200.

In some embodiments, FMs 204a/b are formed with a sufficiently high anisotropy ($H_k$) and sufficiently low magnetic saturation ($M_s$) to increase injection of spin currents. For example, Heusler alloys of high $H_k$ and low $M_s$ are used to form FMs 204a/b. In the following embodiments, FMs 204a/b are described as being Heusler alloys. However, in some embodiments, other magnetic materials exhibiting high $H_k$ and low $M_s$ may be used for forming FMs 204a/b.

Magnetic saturation $M_s$ is generally the state reached when an increase in applied external magnetic field H cannot increase the magnetization of the material (i.e., total magnetic flux density B substantially levels off). Here, sufficiently low $M_s$ refers to $M_s$ less than 200 kA/m (kilo-Amperes per meter). Anisotropy $H_k$ generally refers to the material property which is directionally dependent. Materials with $H_k$ are materials with material properties that are highly directionally dependent. Here, sufficiently high $H_k$ in context of Heusler alloys is considered to be greater than 2000 Oe (Oersted).

For example, a half metal that does not have bandgap in spin up states but does have bandgap in spin down states (i.e., at the energies within the bandgap, the material has 100% spin up electrons). If the Fermi level of the material is in the bandgap, injected electrons will be close to 100% spin polarized. In this context, "spin up" generally refers to the positive direction of magnetization, and "spin down" generally refers to the negative direction of magnetization. Variations of the magnetization direction (e.g. due to thermal fluctuations) result in mixing of spin polarizations.

In some embodiments, Heusler alloys such as $Co_2FeAl$ and $Co_2FeGeGa$ are used for forming FMs 204a/b. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2Val$, $Mn_2VGa$, $Co_2FeGe$, etc. In some embodiments, the input nanomagnets FM1 204a are a Heusler alloy lattice matched to Ag (i.e., the Heusler alloy is engineered to have a lattice constant close (e.g., within 3%) to that of Ag).

In some embodiments, the applied current $I_c$ in the y-direction is converted into spin current $I_s$ by SHE layer 202. In this example, the spin current $I_s$ in the z-direction exerts spin transfer torque to the nanomagnets of FM1 204a and switches the direction of magnetization of FM1 204a. The direction of the magnetic writing to FM 204a is decided by the direction of the applied charge current $I_c$. Positive currents (i.e., currents flowing in the +y direction) produce a spin injection current with transport direction (along the +z direction) and spins pointing to the +x direction. The injected spin current in-turn produces spin torque to align FM1 204a (coupled to SHE layer 202) in the +x or −x direction. The injected spin current $\vec{I}_s$ generated by a charge current $\vec{I}_c$ in FM1 204a is given by:

$$\vec{I}_s = P_{SHE}(w,t,\lambda_{sf},\theta_{SHE})(\hat{z} \times \vec{I}_c) \quad (1)$$

where, the vector of spin current $\vec{I}_s = \vec{I}_\uparrow - \vec{I}_\downarrow$ is the difference of currents with spin along and opposite to the spin direction, $\hat{z}$ is the unit vector perpendicular to the interface, $P_{SHE}$ is the spin Hall injection efficiency which is the ratio of magnitude of transverse spin current to lateral charge current, w is the width of the magnet, t is the thickness of the SHE layer 202, $\lambda_{sf}$ is the spin flip length in SHE layer 202, $\theta_{SHE}$ is the spin Hall angle for SHE layer 202 to free ferromagnetic layer interface. The injected spin angular momentum responsible for the spin torque given by:

$$\vec{S} = \hbar \vec{I}_s/2e \quad (2)$$

In some embodiments, due to strong magnetic exchange between the FM layers (i.e., between FMs 204a/b via FM insulator 203), the FM layers have parallel magnetizations (indicated by the parallel arrows). Compared to the weak magnetic dipole coupling (e.g., 100 Oe) in FIG. 1, the magnetic exchange between FMs 204a/b is much stronger (e.g., 10,000 Oe). In some embodiments, FM insulator 203 provides electrical isolation between FM1 204a and FM2 204b, but allows the spin current $I_s$ from SHE layer 202 to switch all free magnets—FM 204a/b and 203.

In some embodiments, multiple input non-magnetic conductors 201aa, 201bb, 201cc, etc. (not shown) are coupled to the SHE layer 202. For example, multiple input conductors 201aa, 201bb, 201cc are coupled to conductor 201a. Each of these multiple input conductors conducts input charge currents $I_{ca}$, $I_{cb}$, $I_{cc}$, respectively. Then the structure 200 performs the logical function of a majority gate (i.e., the magnetic state is set in accordance with the sign of the majority of the input currents collected by conductor 201a). Alternatively, the structure performs the function of a minority gate (i.e., negation of the majority gate) if an inversion operation is applied to the read-off of the magnetic state, as described below.

Figure 3:
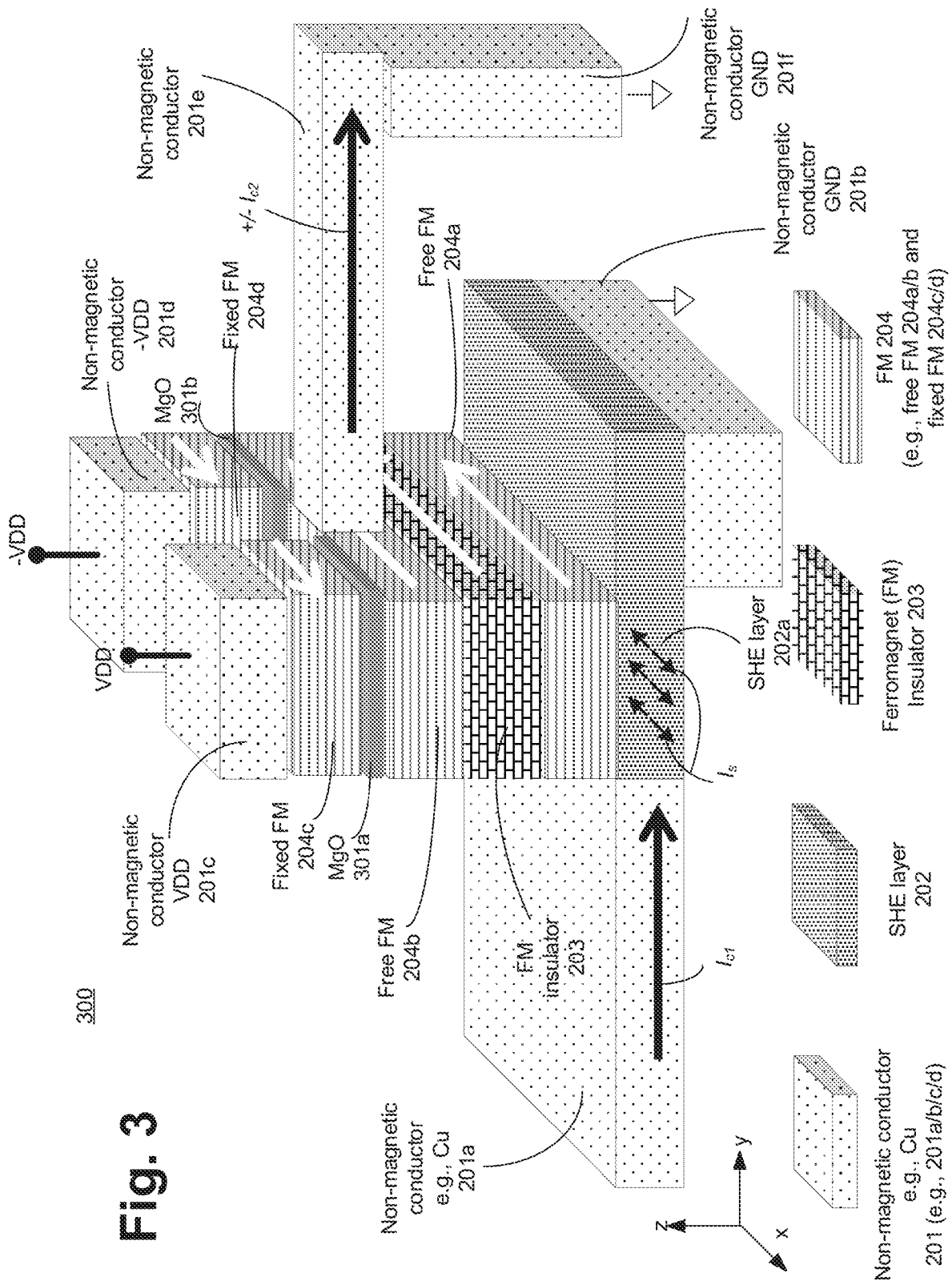
FIG. 3 illustrates a transceiver with the receiver of FIG. 2 and a transmitter based on Tunnel Magnetoresistance (TMR), according to some embodiments of the disclosure.

FIG. 3 illustrates transceiver 300 with receiver of FIG. 2 and transmitter based on TMR, according to some embodiments of the disclosure. It is pointed out that those elements of FIG. 3 having the same reference numbers (or names) as the elements of any other figure can operate or function in any manner similar to that described, but are not limited to such. So as not to obscure the embodiments, differences between FIG. 3 and FIG. 2 are described. In some embodiments, a transmitter section is coupled to the receiver of FIG. 2.

In some embodiments, the transmitter comprises two MTJ devices which are formed using Free FM 204b as the shared free magnet layer. In some embodiments, the first MTJ device is formed by Fixed FM 204c coupled to Free FM 204b via tunneling dielectric MgO 301a. In some embodiments, the second MTJ device is formed by Fixed FM 204d coupled to Free FM 204b via tunneling dielectric MgO 301b. In some embodiments, electrical contracts are coupled to the fixed FMs. For example, non-magnetic conductor 201c is coupled to FM 204c, where non-magnetic conductor 201c is coupled to a positive supply (e.g., VDD). In some embodiments, non-magnetic conductor 201d is coupled to FM 204d, where non-magnetic conductor 201d is coupled to a negative supply (e.g., −VDD).

In one case, the magnetization directions of Fixed FM 204c/d are parallel to the magnetization direction of Free FM 204b (i.e., the magnetization directions of the free and fixed magnetic layers are parallel with respect to each other). For example, the magnetization direction of Free FM 204b is in-plane while the magnetization directions of the Fixed FM 204c/d are in-plane. In another case, the magnetization directions of Fixed FM 204c/d are out-of-plane while the magnetization direction of the Free FM 204b is out-of-plane.

The thickness of a ferromagnetic layer (i.e., fixed or free magnetic layer) may determine its magnetization direction. For example, when the thickness of the ferromagnetic layer is above a certain threshold (depending on the material of the magnet, e.g. approximately 1.5 nm for CoFe), then the ferromagnetic layer exhibits magnetization direction which is in-plane. Likewise, when the thickness of the ferromagnetic layer is below a certain threshold (depending on the material of the magnet), then the ferromagnetic layer exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

In some embodiments, the transmitter further comprises a non-magnetic conductor 201e with one of its ends coupled to FM 204b to collect charge current and another end coupled to another non-magnetic conductor 201f. In some embodiments, non-magnetic conductor 201e behaves as a common node of a resistor divider, where the resistances are the resistances of the two MTJs (one biased with VDD and the other with −VDD) coupled to the common node (i.e., non-magnetic conductor 201e).

The embodiment of FIG. 3 is more compact than the logic of FIG. 1 because transceiver 300 has all its magnets stacked on top of each other while the magnets in FIG. 1 are located into two different stacks (i.e., stacks in the receiver side and the transmitter side). By stacking all FMs (i.e., FM 204a/b, FM insulator 203, and FM 204c/d), a more manufacture-able logic is formed. In some embodiments, by stacking all FMs (i.e., FM 204a/b, FM insulator 203, and FM 204c/d) together, the FMs can be formed in situ (i.e., without breaking vacuum). As such, a higher quality device is formed.

In some embodiments, the transceiver 300 is cascade-able. For example, non-magnetic conductor 201e of transceiver 300 can be coupled to a non-magnetic conductor 201a of another receiver (not shown). In this way, the logic elements can be cascaded in a VLSI (Very Large Scale Integrated) circuit.

In some embodiments, output 201e of transceiver 300 can be one of multiple inputs to a logic circuit. For example output 201ea of transceiver 300a (not shown), output 201eb of transceiver 300b (not shown), output 201ec of transceiver 300c (nor shown), etc. are coupled to input 201a of transceiver 300. Each of these conductors 201ea, 201eb, and 201ec, for example, conducts charge currents $I_{ca}$, $I_{cb}$, and $I_{cc}$, respectively. Then transceiver 300 performs the logical function of a majority gate (i.e., the sign of the output current in 201e is set in accordance with the sign of the majority of the input charge currents $I_{ca}$, $I_{cb}$, and $I_{cc}$), in accordance with some embodiments. Alternatively, transceiver 300 can perform the function of a minority gate (i.e., negation of the majority gate) if an inversion operation is applied to the read-off (i.e., the opposite direction of the output current in 201e is set as positive).

Figure 4:
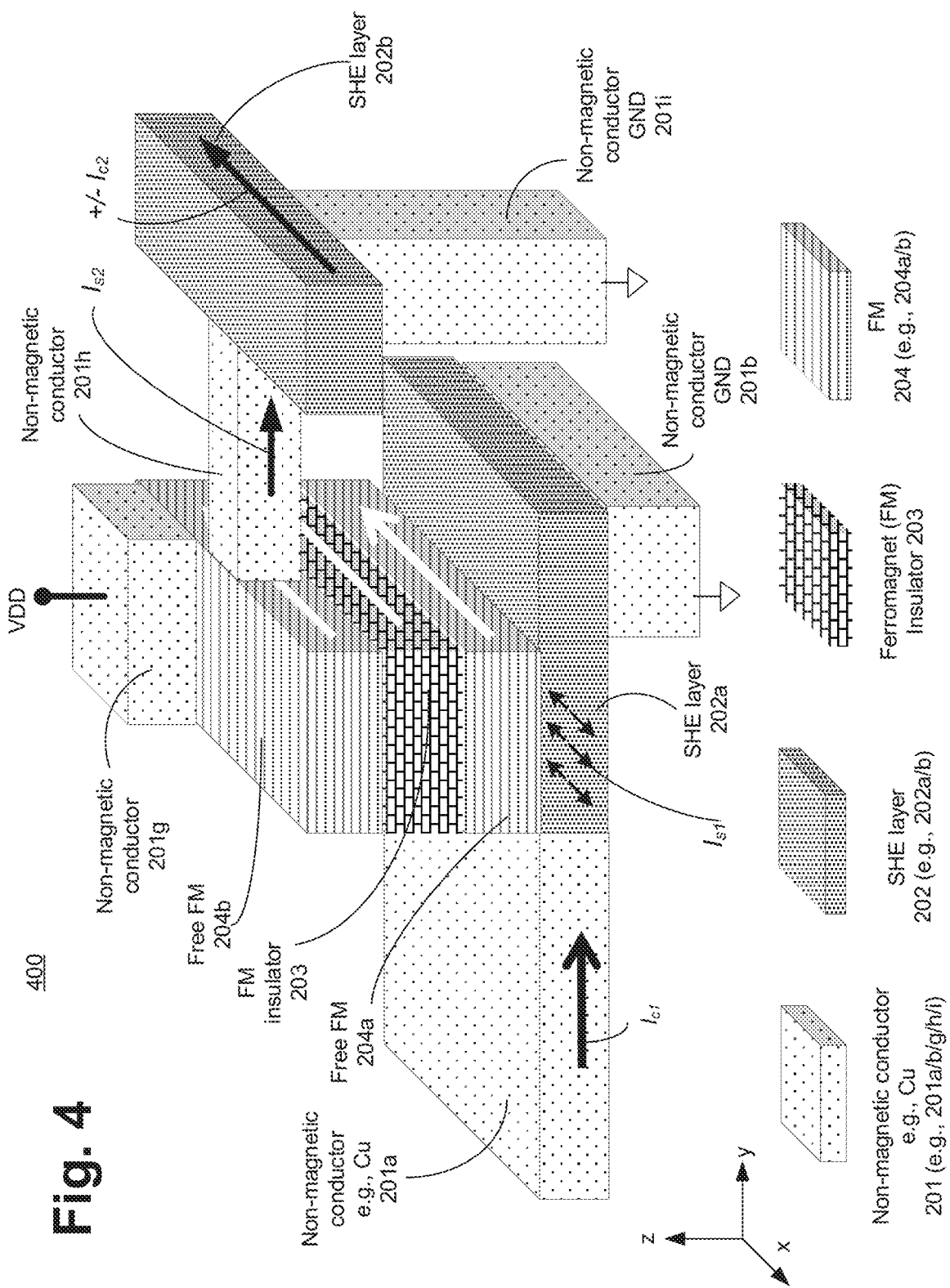
FIG. 4 illustrates a transceiver with the receiver of FIG. 2 and a transmitter based on Inverse SOC (ISOC), according to some embodiments of the disclosure.

FIG. 4 illustrates transceiver 400 with receiver of FIG. 2 and transmitter based on Inverse SOC (ISOC), according to some embodiments of the disclosure. It is pointed out that those elements of FIG. 4 having the same reference numbers (or names) as the elements of any other figure can operate or function in any manner similar to that described, but are not limited to such. So as not to obscure the embodiments, differences between FIG. 4 and FIG. 2 are described. In some embodiments, a transmitter section is coupled to the receiver of FIG. 2.

In some embodiments, the transmitter comprises a non-magnetic conductor 201g which is formed over a portion of FM 204b. In some embodiments, the transmitter further comprises non-magnetic conductor 201h which is provided such that one end of non-magnetic conductor 201h couples to FM 204b while the other end of 201h couples to SHE layer 202b (also part of the transmitter). In some embodiments, at least a part of the bottom surface of SHE layer 202b is coupled to ground via non-magnetic conductor 201i. Here, SHE layer 202a provides charge-to-spin conversion while SHE layer 202b provides spin-to-charge conversion.

In some embodiments, spin-to-charge conversion is achieved via spin orbit interaction in metallic interfaces (i.e., using Inverse Rashba-Edelstein Effect (IREE) and/or Inverse SHE (ISHE), where a spin current injected from an input magnet produces a charge current). In some embodiments, SHE layer 202a has an interface layer that converts charge to spin current using Rashba-Edelstein effect while the bulk portion of SHE layer 202a converts charge to spin current using SHE. In some embodiments, SHE layer 202b has an interface layer that converts spin to charge current using ISHE while the bulk portion of SHE layer 202b converts spin to charge current using SHE.

Table 1 summarizes transduction mechanisms for converting spin current to charge current and charge current to spin current for bulk materials and interfaces.

TABLE 1

| | Transduction mechanisms for Spin to Charge and Charge to Spin Conversion due to SOC | |
|---|---|---|
| | Charge → Spin | Spin → Charge |
| Bulk | Spin Hall effect | Inverse spin Hall effect |
| Interface | Rashba-Edelstein effect | Inverse Rashba-Edelstein effect |

In some embodiments, 202a/b layers of FIG. 4 (and SHE layer 202 of FIG. 2) are a super-lattice stack which is functionally equivalent to a material which provides spin Hall effect. In some embodiments, super-lattice stack of SHE layers 202a/b comprises layers of metals, such as Copper (Cu), Silver (Ag), Gold (Au), and layers of a surface alloy, e.g. Bismuth (Bi) on Ag. In some embodiments, a FM layer is deposited on top of the super-lattice 202b, where the FM layer is made from CFGG (i.e., Cobalt (Co), Iron (Fe), Germanium (Ge), or Gallium (Ga) or a combination of them). In some embodiments, 'N' number of layers of surface alloy (e.g., interface layer) and metal (e.g., bulk layer) are stacked in alternating fashion, where 'N' is an integer, for form super-lattice stack 202b. In one example, N=10 which is sufficient to convert input spin current to corresponding charge current with efficiency of one or higher. In other examples, other number of layers may be used to trade off conversion efficiency versus area of the stack.

In some embodiments, super-lattice of SHE layer 202a comprises an interface layer, (i.e., surface alloy) coupled to FM layer 204a, and bulk layer (e.g., layer(s) of metal) coupled to the interface layer. In some embodiments, super-lattice of SHE layer 202a comprises an interface layer, (i.e., surface alloy) and bulk layer (e.g., layer(s) of metal) coupled to the interface layer.

In some embodiments, FM layer 204a above the super-lattice of SHE layer 202a is formed of $Co_2FeGeGa$, $Co_2FeAl$, or other Heusler alloys, etc. In some embodiments, the surface alloy is one of: Bi—Ag, Antimony-Bismuth (Sb—Bi), Sb—Ag, or Lead-Nickel (Pb—Ni), etc. In some embodiments, the metal of the bulk layer is a noble metal (e.g., Ag, Cu, and Au) doped with other elements for group 4d and/or 5d of the Periodic Table. In some embodiments, one of the metals of the surface alloy is an alloy of heavy metal or of materials with high SOC strength, where the SOC strength is directly proportional to the fourth power of the atomic number of the metal.

In some embodiments, all metal layers in the stack of SHE layers 202a/b are of the same type of metal. For example, all metal layers of the stack SHE layers 202a/b are formed of Ag. In other embodiments, different metal layers may be used in the same stack for the metal portion of the layers. For example, some metal layers of the stack of SHE layers 202a/b are formed of Ag and others are formed of Cu.

In some embodiments, an atomic structure of the stack of SHE layers 202a/b shows non-uniform patterns of Ag and Bi atoms of the surface alloy sandwiched between layers of Cu or other metals. Here, the crystals of Ag and Bi have lattice mismatch (i.e., the distance between neighboring atoms of Ag and Bi is different). In some embodiments, the surface alloy (i.e., the interface layer) is formed with surface corrugation resulting from the lattice mismatch (i.e., the positions of Bi atoms are offset by varying distance from a plane parallel to a crystal plane of the underlying metal). The surface alloy is a structure not symmetric relative to the mirror inversion defined by a crystal plane. This inversion asymmetry leads to spin-orbit coupling in electrons near the surface (also referred to as the Rashba effect).

Here, sufficiently matched atomistic crystalline layers refer to matching of the lattice constant 'a' within a threshold level above which atoms exhibit dislocation which is harmful to the device (i.e., the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants).

The direction of the second charge current $I_{c2}$ depends on the direction of the second spin current $I_{s2}$. In some embodiments, the direction of the second spin current $I_{s2}$ depends on the magnetizations of FM layers 204a/b, which in-turn depends on the direction of torque provided by the first spin current $I_{s1}$. In some embodiments, the direction of the first spin current $I_{s1}$ depends on the direction of charge current $I_{c1}$.

In some embodiments, the interface surface alloy of $BiAg_2/PbAg_2$ comprises of a high density two dimensional (2D) electron gas with high Rashba SOC. The spin orbit mechanism responsible for spin-to-charge conversion is described by Rashba effect in 2D electron gases. In some embodiments, 2D electron gases are formed between Bi and Ag, and when current flows through the 2D electron gases, it becomes a 2D spin gas because as charge flows, electrons get polarized.

The Hamiltonian energy $H_R$ of the SOC electrons in the 2D electron gas corresponding to the Rashba effect is expressed as:

$$H_R = \alpha_R (k \times \hat{z}) \cdot \delta \quad (3)$$

where $\alpha_R$ is the Rashba coefficient, 'k' is the operator of momentum of electrons, $\hat{z}$ is a unit vector perpendicular to the 2D electron gas, and $\delta$ is the operator of spin of electrons. The spin polarized electrons with direction of polarization in-plane (in the xy-plane) experience an effective magnetic field dependent on the spin direction which is given as:

$$\vec{B}(\vec{k}) = \frac{\alpha_R}{\mu_B}(\vec{k} \times \hat{z}) \quad (4)$$

where $\mu_B$ is the Bohr magneton.

This results in the generation of a charge current in the SHE layer 202b proportional to the spin current $I_{s2}$. The spin orbit interaction at the Ag/Bi interface (i.e., the Inverse Rashba-Edelstein Effect (IREE)) produces a charge current $I_{c2}$ in the horizontal direction which is expressed as:

$$I_{c2} = \frac{\lambda_{IREE} I_s}{w_m} \quad (5)$$

where $w_m$ is width of the magnet, and $\lambda_{IREE}$ is the IREE constant (with units of length) proportional to $\alpha_R$.

The IREE effect produces spin-to-charge current conversion around 0.1 with existing materials at 10 nm magnet width. For scaled nanomagnets (e.g., 5 nm width) and exploratory SHE materials such as $Bi_2Se_3$, the spin-to-charge conversion efficiency can be between 1 and 2.5, in accordance with some embodiments. The net conversion of the drive charge current $I_d$ to magnetization dependent charge current is:

$$I_{c2} = \pm \frac{\lambda_{IREE} P I_d}{w_m} \quad (6)$$

where P is the spin polarization.

In some embodiments, the transceiver 400 is cascadeable. For example, SHE layer 202b can be coupled to a non-magnetic conductor of another receiver (e.g., 201a of another receiver (not shown)). In some embodiments, output 202b of a transceiver 400 can be one of multiple inputs to a logic circuit. For example output 202ba of transceiver 400a (not shown), output 202bb of transceiver 400b (not shown), output 202bc of transceiver 400c (not shown), etc. are coupled to input 201a of transceiver 400. Each of these conductors conducts charge currents $I_{ca}$, $I_{cb}$, $I_{cc}$, etc. Then transceiver 400 performs the logical function of a majority gate (i.e., the sign of the output current in 202b is set in accordance with the sign of the majority of the input charge currents $I_{ca}$, $I_{cb}$, and $I_{cc}$ in conductors 202ba, 202bb, and 202bc, respectively). Alternatively, transceiver 400 performs the function of a minority gate (i.e., negation of the majority gate) if an inversion operation is applied to the read-off, i.e. the opposite direction of the output current in 202b is set as positive.

Figure 5:
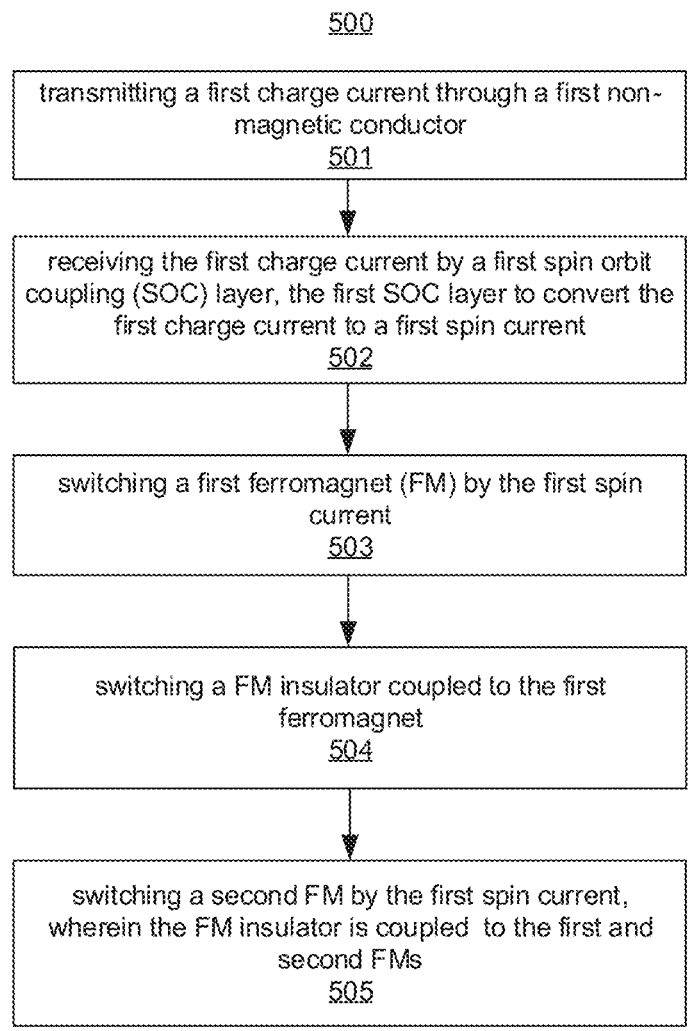
FIG. 5 illustrates a flowchart of a method for operating the receiver of FIG. 2, according to some embodiments of the disclosure.

FIG. 5 illustrates flowchart 500 of a method for operating the receiver of FIG. 2 (which is coupled to transmitters shown with reference to FIG. 3 and FIG. 4), according to some embodiments of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, a first charge current $I_{c1}$ is provided to SHE layer 202a via non-magnetic conductor 201a. At block 502, the first charge current $I_{c1}$ is received by SHE layer 202a. In some embodiments, SHE layer 202a converts the first charge current $I_{c1}$ into first spin current $I_{s1}$. The first spin current $I_{s1}$ exerts torque on FM 204a. At block 503, the torque exerted by the first spin current $I_{s1}$ switches the magnetization of FM 204*a*. At block 504, the nanomagnets of FM insulator 203 coupled to FM 204*a* also switches in the same direction as the magnetization of FM 204*a*. At block 505, FM 204*b* (i.e., second FM) also switches by the torque exerted by the first spin current $I_{s1}$ via strong exchange coupling.

In some embodiments, the first spin current $I_{s1}$ from FM 204*b* is carried over to SHE layer 202*b* via non-magnetic conductor 201*h* as second spin current $I_{s2}$. In some embodiments, the second spin current $I_{s2}$ is converted back to charge current (i.e., second charge current $I_{c2}$) via ISHE (Inverse Spin Hall effect) by SHE layer 202*b*. In some embodiments, the direction of the second charge current $I_{c2}$ depends on the direction of magnetization of FM 204*b* (which in-turn) depends on the magnetization directions of FM 203*a*.

Figure 6:
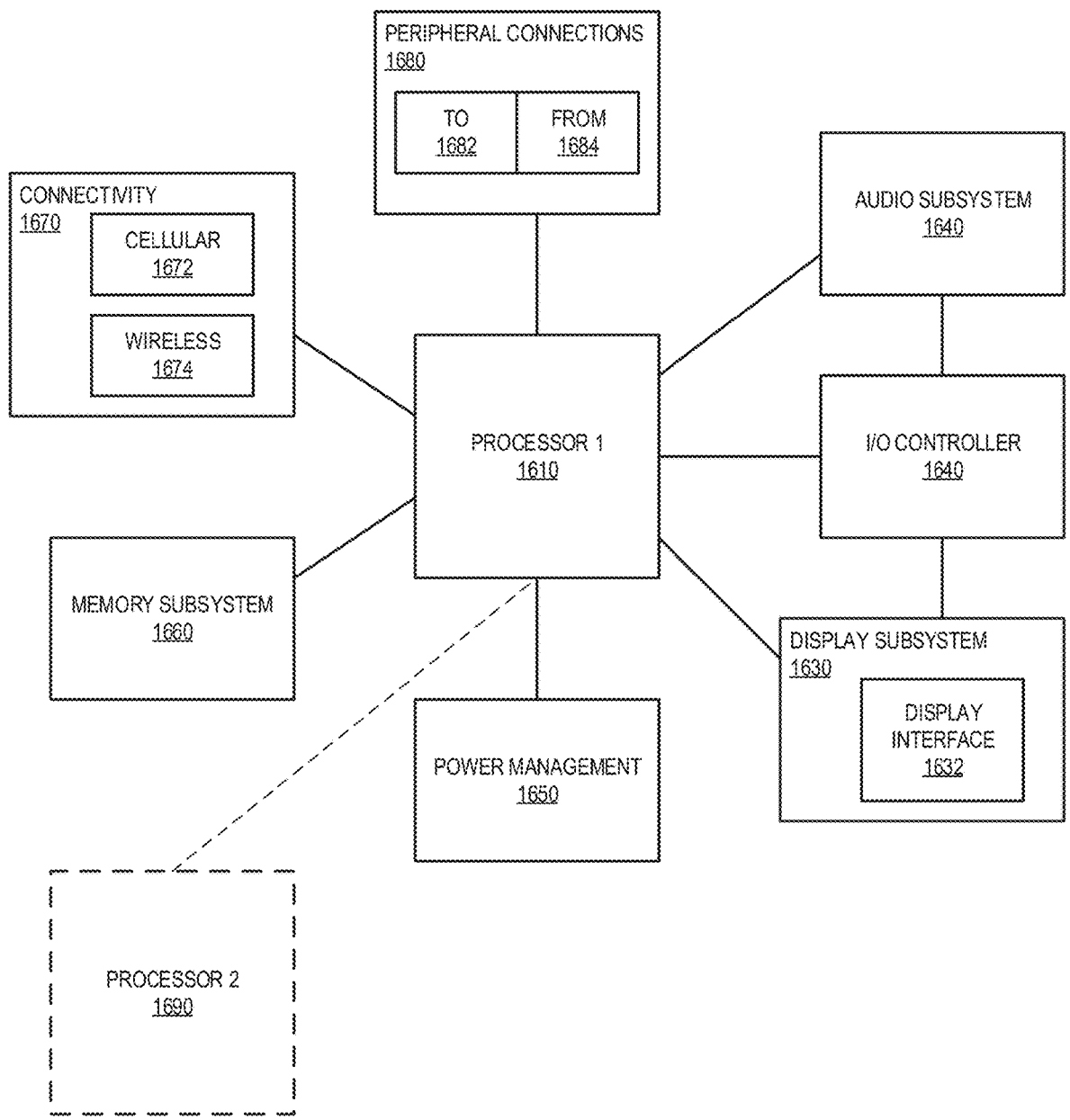
FIG. 6 illustrates a smart device or a computer system or a SoC (System-on-Chip) with receiver of FIG. 2 and/or transceivers of FIGS. 3-4, according to some embodiments.

FIG. 6 illustrates a smart device or a computer system or a SoC (System-on-Chip) with receiver of FIG. 2 and/or transceivers of FIGS. 3-4, according to some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with receiver of FIG. 2 and/or transceivers of FIGS. 3-4, according to some embodiments discussed. Other blocks of the computing device 1600 may also include receiver of FIG. 2 and/or transceivers of FIGS. 3-4, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first non-magnetic conductor; a first spin orbit coupling (SOC) layer coupled to the first non-magnetic conductor; a first ferromagnet (FM) coupled to the SOC layer; a second FM; and a FM insulator sandwiched between the first and second FMs. In some embodiments, the first and second FMs are formed of one of: a Heusler alloy, Co, Fe, Ge, Ga, or a combination of them.

In some embodiments, the FM insulator is formed of one of: Yttrium-iron garnet (YIG) $Y_3Fe_5O_{12}$, magnetite $Fe_3O_4$, $Fe_2O_3$, NiO, $Tb_3Fe_5O_{12}$, or $CrO_2$. In some embodiments, the first SOC layer is formed of one or more of: β-Ta, β-W, W, Pt, Cu doped with Iridium, Cu doped with Bismuth, or Cu doped an element of 3d, 4d, 5d, 4f, or 5f of periodic table groups. In some embodiments, the first SOC layer comprises: an interface layer coupled to the first FM; and a bulk layer coupled to the interface layer and another non-magnetic metal. In some embodiments, the interface layer is formed of at least one of: Bi and Ag; Bi and Cu; or Pb and Ag.

In some embodiments, the bulk layer is formed of at least one of: Ag, Cu, or Au. In some embodiments, the apparatus comprises a second non-magnetic conductor coupled to the first SOC layer, wherein the second non-magnetic conductor is coupled to ground. In some embodiments, the apparatus comprises a third non-magnetic conductor coupled to a portion of the second FM and to a power supply. In some embodiments, the apparatus comprises: a second SOC layer; a fourth non-magnetic conductor coupled to a portion of the second FM and to the second SOC layer; and a fifth non-magnetic conductor coupled to a portion of the second SOC layer and to ground.

In some embodiments, at least one of the first, second, third, fourth, and fifth non-magnetic conductors are formed of Cu. In some embodiments, the apparatus comprises a non-magnetic interconnect coupled to the second FM at one end and coupled to a ground node at another end. In some embodiments, the apparatus comprises: a first stack of an insulator, a fixed ferromagnet, and a non-magnetic conductor coupled to a positive power supply; and a second stack of an insulator, a fixed ferromagnet, and a non-magnetic conductor coupled to a negative power supply, wherein the first and second stacks are separated by a distance and coupled to portions of the second FM.

In some embodiments, the insulators of the first and second stacks are formed of MgO. In some embodiments, the first and second FMs are free magnets. In some embodiments, the first SOC layer converts charge current to a spin current which switches the first FM. In some embodiments, the first SOC layer exhibits spin Hall effect when a charge current is received from the first non-magnetic conductor.

In another example, a system is provided which comprises: a memory; a processor coupled to the memory, the processor having an apparatus according to the apparatus described above; and a wireless interface for allowing the processor to communicate with another device. In some embodiments, the apparatus is cascadable with another apparatus. In some embodiments, the other apparatus is according to the apparatus described above. In some embodiments, the apparatus is a majority gate. In some embodiments, the apparatus is a minority gate.

In another example, a method is provided which comprises: transmitting a first charge current through a first non-magnetic conductor; receiving the first charge current by a first spin orbit coupling (SOC) layer, the first SOC layer to convert the first charge current to a first spin current; switching a first ferromagnet (FM) by the first spin current; switching an insulating FM coupled to the first ferromagnet; and switching a second FM by the first spin current, wherein the insulating FM is coupled to the first and second FMs. In some embodiments, the method comprises: receiving the first spin current via the second FM; providing the received first spin current to a second SOC layer; and converting the received first spin current to a second charge current by the second SOC layer. In some embodiments, the method comprises applying a positive supply to a portion of the second FM via a third non-conducting metal.

In another example, an apparatus is provided which comprises: means for transmitting a first charge current; means for receiving the first charge current and converting the first charge current to a first spin current; means for switching a first ferromagnet (FM) by the first spin current; means for switching an insulating FM coupled to the first ferromagnet; and means for switching a second FM by the first spin current, wherein the insulating FM is coupled to the first and second FMs. In some embodiments, the apparatus comprises: means for receiving the first spin current via the second FM; and means for converting the first spin current to a second charge current. In some embodiments, the apparatus comprises: means for applying a positive supply to a portion of the second FM.

In another example, a system is provided which comprises: a memory; a processor coupled to the memory, the processor having an apparatus according to the apparatus described above; and a wireless interface for allowing the processor to communicate with another device. In some embodiments, the apparatus is cascadable with another apparatus. In some embodiments, the other apparatus is according to the apparatus described above. In some embodiments, the apparatus is a majority gate. In some embodiments, the apparatus is a minority gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a conductor comprising a non-magnetic material;
    a first layer comprising spin orbit (SOC) material, wherein the first layer is coupled to the conductor;
    a first magnet coupled to the first layer;
    a second magnet; and
    a second layer comprising a magnetic insulative material, wherein the second layer is between the first and second magnets such that magnetic insulative material is in direct contact with the first and second magnets;
    wherein the first layer comprises:
    a third layer coupled to the first magnet, wherein the first layer includes one or more of: Bi and Ag; Bi and Cu; or Pb and Ag; and
    a fourth layer coupled to the third layer and another non-magnetic metal, wherein the fourth layer includes one of: Ag, Cu, or Au.

2. The apparatus of claim 1, wherein the first and second magnets includes one or more of: a Heusler alloy, Co, Fe, Ge, Ga, or a combination of them.

3. The apparatus of claim 1, wherein the magnetic insulative material comprises one of: Y, Fe, Ni, Tb, or Cr.

4. The apparatus of claim 1, wherein the first layer includes one or more of: β-Ta, β-W, W, Pt, Cu doped with Iridium, Cu doped with Bismuth, or Cu doped an element of 3d, 4d, 5d, 4f, or 5f of periodic table groups.

5. The apparatus of claim 1, wherein the conductor is a first conductor, wherein the apparatus comprises a second conductor including a non-magnetic material, wherein the second conductor is coupled to the first layer, and wherein the second conductor is coupled to ground.

6. The apparatus of claim 5 comprises a third conductor which includes a non-magnetic material, wherein the third conductor is coupled to a portion of the second magnet and to a power supply.

7. The apparatus of claim 6 comprises:
    a fifth layer comprising SOC material;
    a fourth conductor including a non-magnetic material, wherein the fourth conductor is coupled to a portion of the second magnet and to the fifth layer; and
    a fifth conductor including a non-magnetic material, the fifth conductor is coupled to a portion of the fifth layer and to ground.

8. The apparatus of claim 7, wherein at least one of the first, second, third, fourth, or fifth conductors include Cu.

9. The apparatus of claim 1 comprises an interconnect, which includes a non-magnetic material, wherein the interconnect is coupled to the second magnet at one end and coupled to a ground node at another end.

10. The apparatus of claim 1 comprises:
a first stack including an insulator, a magnet with fixed magnetization, and a conductor with a non-magnetic material, wherein the conductor is coupled to a positive power supply; and
a second stack including an insulator, a magnet with fixed magnetization, and a conductor with non-magnetic material, wherein the conductor is coupled to a negative power supply,
wherein the first and second stacks are separated by a distance and coupled to portions of the second magnet.

11. The apparatus of claim 10, wherein the insulators of the first and second stacks comprise MgO.

12. The apparatus of claim 1, wherein the first and second magnets comprise magnets with free or unfixed magnetizations.

13. The apparatus of claim 12, wherein the first layer is to convert charge current to a spin current which is to switch the first magnet.

14. The apparatus of claim 1, wherein the first layer is to exhibit spin Hall effect when a charge current is received from the first conductor.

15. A system comprising:
a memory;
a processor coupled to the memory, the processor having an apparatus which comprises:
a first conductor comprising a non-magnetic material;
a first layer comprising spin orbit (SOC) material, wherein the first layer is coupled to the first conductor;
a first magnet coupled to the first layer;
a second magnet; and
a second layer comprising a magnetic insulative material, wherein the second layer is between the first and second magnets such that magnetic insulative material is in direct contact with the first and second magnets;
a second conductor including a non-magnetic material, wherein the second conductor is coupled to the first layer, wherein the second conductor is coupled to a ground node;
a third conductor which includes a non-magnetic material, wherein the third conductor is coupled to a portion of the second magnet and to a power supply node;
a fifth layer comprising SOC material;
a fourth conductor including a non-magnetic material, wherein the fourth conductor is coupled to a portion of the second magnet and to the fifth layer; and
a fifth conductor including a non-magnetic material, the fifth conductor is coupled to a portion of the fifth layer and to ground; and
a wireless interface to allow the processor to communicate with another device.

16. The system of claim 15, wherein the apparatus is cascadable with another apparatus.

17. The system of claim 15, wherein the apparatus is a majority gate, or a minority gate.

18. A method comprising:
transmitting a first charge current through a first non-magnetic conductor;
receiving the first charge current by a first spin orbit coupling (SOC) layer, wherein the first SOC layer is to convert the first charge current to a first spin current;
switching a first ferromagnet (FM) by the first spin current;
switching an insulating FM coupled to the first FM;
switching a second FM by the first spin current, wherein the insulating FM is directly coupled to the first and second FMs;
receiving the first spin current via the second FM;
providing the received first spin current to a second SOC layer; and
converting the received first spin current to a second charge current by the second SOC layer.

* * * * *